US012709803B2

(12) United States Patent
Patel H B et al.

(10) Patent No.: US 12,709,803 B2
(45) Date of Patent: Aug. 18, 2026

(54) PRECURSOR DELIVERY SYSTEM FOR SEMICONDUCTOR DEVICE FORMATION

(71) Applicant: Applied Materials, Inc., Santa Clara, CA (US)

(72) Inventors: Shashidhara Patel H B, Bangalore (IN); Nagaraj Naik, Bangalore (IN); Muhannad Mustafa, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 151 days.

(21) Appl. No.: 18/118,499

(22) Filed: Mar. 7, 2023

(65) Prior Publication Data

US 2024/0247374 A1 Jul. 25, 2024

(30) Foreign Application Priority Data

Jan. 23, 2023 (IN) ............................. 202341004384

(51) Int. Cl.
*C23C 16/455* (2006.01)
*C23C 16/44* (2006.01)

(52) U.S. Cl.
CPC .... *C23C 16/45561* (2013.01); *C23C 16/4408* (2013.01)

(58) Field of Classification Search
None
See application file for complete search history.

(56) References Cited

U.S. PATENT DOCUMENTS 4,522,149 A 6/1985 Garbis et al.
6,984,591 B1 1/2006 Buchanan et al.
2005/0000435 A1 1/2005 Lee et al.
2005/0095859 A1 5/2005 Chen et al.
2005/0166847 A1 8/2005 Derderian
2006/0037540 A1 2/2006 Woelk et al.
2008/0268143 A1 10/2008 Vahlas et al.
2009/0186479 A1 7/2009 Okabe et al.
2010/0285206 A1 11/2010 Woelk et al.
2011/0311726 A1 12/2011 Liu et al.
2014/0308445 A1 10/2014 Na et al.
2017/0159175 A1 6/2017 Yagi et al.
2018/0251893 A1 9/2018 Hohn et al.
2020/0071827 A1 3/2020 Aubuchon
2021/0260550 A1 8/2021 Chen et al.

FOREIGN PATENT DOCUMENTS

JP H11117070 A 4/1999
JP 2017179397 A 10/2017
KR 20160134544 A 11/2016
WO 2007143743 A2 12/2007
WO 2009015271 A1 1/2009

OTHER PUBLICATIONS

PCT International Search Report and Written Opinion in PCT/US2019/048992 mailed Dec. 4, 2019, 12 pages.
PCT International Search Report and Written Opinion in PCT/US2024/012318 dated May 20, 2024, 12 pages.

*Primary Examiner* — Eric W Golightly
(74) *Attorney, Agent, or Firm* — SERVILLA WHITNEY LLC

(57) ABSTRACT

Embodiments of precursor delivery systems are described herein. The precursor delivery systems include a reservoir having a cylindrical body, a conical shaped inlet on a first end of the cylindrical body, and a conical shaped outlet on a second end of the cylindrical body. Each of the conical shaped inlet and the conical shaped outlet independently have an angle in a range of from 5 degrees to 45 degrees.

20 Claims, 3 Drawing Sheets

PRECURSOR DELIVERY SYSTEM FOR SEMICONDUCTOR DEVICE FORMATION

CROSS-REFERENCE TO RELATED APPLICATIONS

This application claims priority to Indian Application No. 202341004384, filed Jan. 23, 2023, the entire disclosure of which is hereby incorporated by reference herein.

TECHNICAL FIELD

Embodiments of the present disclosure generally relate to precursor delivery systems. In particular, embodiments of the disclosure relate to precursor delivery systems for use in semiconductor device formation processes.

BACKGROUND

Efficient deposition processes require that a chemical precursor be delivered into a processing chamber in a relatively short period of time. As semiconductor device requirements grow increasingly smaller, the surface area of these semiconductor devices increases.

Reservoirs are components for storing chemical precursors and delivering the chemical precursors to processing chambers at a predetermined (sometimes continuous) rate. Current delivery systems often fail to deliver consistent precursor concentrations over time. In some cases, the pulse delivered is higher in concentration at the beginning of a pulse than at the end of a pulse. In some cases, the concentration of precursor is higher at the beginning of a process than at the end of a process. These variations can lead to irregular deposition and device failure. Further, some current delivery systems often deliver precursor pulses which contain particles of solid precursors.

During periodic maintenance and/or servicing of the processing chambers, the reservoirs may be exposed to moisture. The moisture may react with residual gases from the reservoirs, resulting in the presence of particles. The particles must be removed by purging prior to semiconductor wafer processing. Purging these particles is required to reduce defects on a semiconductor wafer that will be positioned in a processing chamber. Particles are typically removed (purged) from the processing chambers by flowing a purge gas, such as argon (Ar). In current precursor delivery systems with tube-shaped reservoirs, the purge process lasts in a range of from about 16 hours to about 24 hours to provide a reservoir that is substantially free of particles. Accordingly, a large amount of purge gas is required to complete the purge process using current precursor delivery systems.

Current reservoir designs have flat top and bottom surfaces and flat inlets and outlets. The presence of the flat surfaces, which form corners, creates dead volume at the inlets and the outlets of the reservoir. Due to the presence of inaccessible surface area portions of the reservoir (e.g., the flat surfaces and corners) and irregular flow path of the purge gases (e.g., a non-laminar flow), periodic maintenance and/or servicing of the processing chamber components is often inefficient.

Accordingly, there is a need for improved precursor delivery systems which provide consistent, high concentration pulses of precursors and reduce the amount of time to purge the reservoir.

SUMMARY

One or more embodiments of the disclosure relate to precursor delivery system comprising a reservoir having a cylindrical body, a conical shaped inlet on a first end of the cylindrical body, and a conical shaped outlet on a second end of the cylindrical body, each of the conical shaped inlet and the conical shaped outlet independently having an angle in a range of from 5 degrees to 45 degrees.

Additional embodiments of the disclosure relate to precursor delivery system comprising a reservoir and a controller. The reservoir has a cylindrical body, a conical shaped inlet on a first end of the cylindrical body, and a conical shaped outlet on a second end of the cylindrical body. Each of the conical shaped inlet and the conical shaped outlet independently have an angle in a range of from 5 degrees to 45 degrees. The conical shaped inlet has an inlet valve connected to an inlet line and the conical shaped outlet has an outlet valve connected to an outlet line. The controller is connected to each of the inlet valve and the outlet valve, the controller configured to close the outlet valve to pressurize the reservoir and open the outlet valve to provide a uniform flow of a purge gas from the reservoir through the conical shaped outlet.

Further embodiments of the disclosure relate to a method of removing particles from a reservoir. The method comprises: providing a reservoir having a cylindrical body, a conical shaped inlet on a first end of the cylindrical body and a conical shaped outlet on a second end of the cylindrical body. Each of the conical shaped inlet and the conical shaped outlet independently have an angle in a range of from 5 degrees to 45 degrees. The conical shaped inlet has an inlet valve connected to an inlet line and the conical shaped outlet has an outlet valve connected to an outlet line. The inlet line and the outlet line are in fluid communication with the reservoir. The method further comprises using a controller to continuously provide a flow of a purge gas through the outlet line to remove particles from the reservoir.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

DETAILED DESCRIPTION

Figure 1:
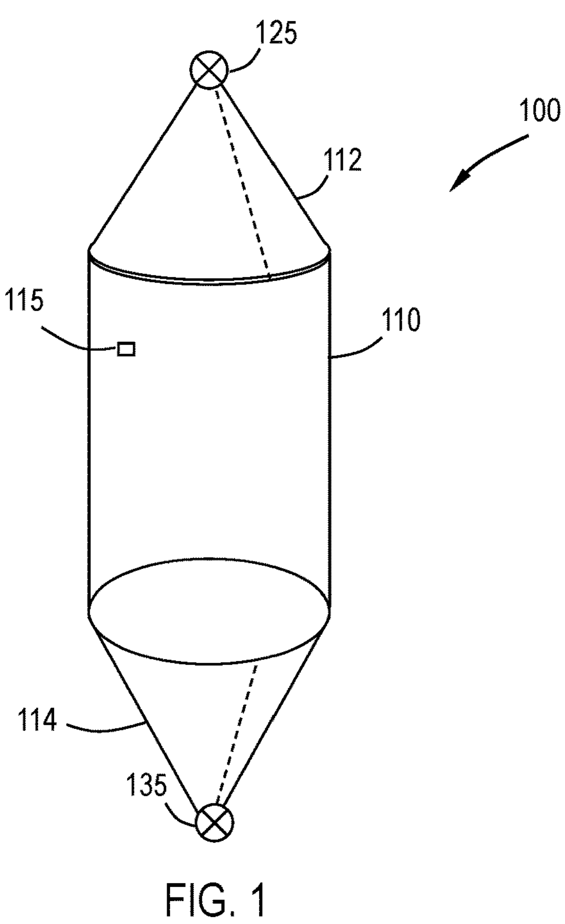
FIG. 1 illustrates a schematic isometric view of a precursor delivery system according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

Embodiments of the present disclosure relate to apparatuses and methods for precursor delivery during a deposition process (e.g., an atomic layer deposition (ALD) process). Some embodiments of the disclosure advantageously provide for the delivery of higher precursor concentrations in a shorter period of time relative to current tube-shaped precursor delivery systems. Some embodiments of the disclosure advantageously provide apparatuses and methods which have the ability to burst a high dose of chemistry into a processing chamber. High burst delivery processes may be useful for deposition on high surface area structured wafers.

Some embodiments advantageously provide for greater control over the amount of precursor delivered to a process chamber during a deposition process. Some embodiments of the disclosure advantageously provide for the delivery of more consistent precursor concentrations over time during a semiconductor substrate processing method.

Embodiments of the disclosure provide improved reservoir designs. Embodiments of the present disclosure advantageously provide reservoirs that provide continuous chemical precursor flow into a processing chamber. The reservoirs of the present disclosure may be used as part of any known deposition technique. In some embodiments, the reservoirs are used in atomic layer deposition (ALD) processes, chemical vapor deposition (CVD) processes, pulsed CVD processes, plasma-enhanced atomic layer (PEALD) processes, and/or plasma-enhanced chemical vapor deposition (PECVD) processes.

Some embodiments of the disclosure advantageously provide for the delivery of a precursor with fewer solid particles and lower levels of particle entrainment in resulting films. Some embodiments advantageously provide reservoirs configured to reduce the amount of time to purge the reservoir and remove an increased number of particles from the reservoir.

Embodiments of the present disclosure provide reservoirs that meet the Standard Specification for Seamless and Welded Austenitic Stainless Steel Tubing for General Service, as disclosed in ASTM A269.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface are exposed simultaneously to the two or more reactive compounds so that no given point on the substrate is exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second reactive gas (i.e., a second precursor or compound B) is pulsed into the reaction zone followed by a second delay. During each time delay, a purge gas, such as argon or helium, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive gases are alternatively pulsed until a desired film or film thickness is formed on the substrate surface. In either scenario, the ALD process of pulsing compound A, purge gas, compound B and purge gas is referred to as a cycle. A cycle can start with either compound A or compound B and continue the respective order of the cycle until achieving a film with the predetermined thickness.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

In some embodiments, the reactant comprises an inert, diluent and/or carrier gas. The inert, diluent and/or carrier gas may be mixed with the reactive species and can be pulsed or have a constant flow. In some embodiments, the carrier gas is flowed into the processing chamber at a constant flow in the range of about 1 to about 20000 sccm. The carrier gas may be any gas which does not interfere with the film deposition. For example, the carrier gas may comprise one or more of argon, helium, nitrogen, neon, or the like, or combinations thereof. In one or more embodiments, the carrier gas is mixed with the reactive species prior to flowing into the reservoir.

Figure 2:
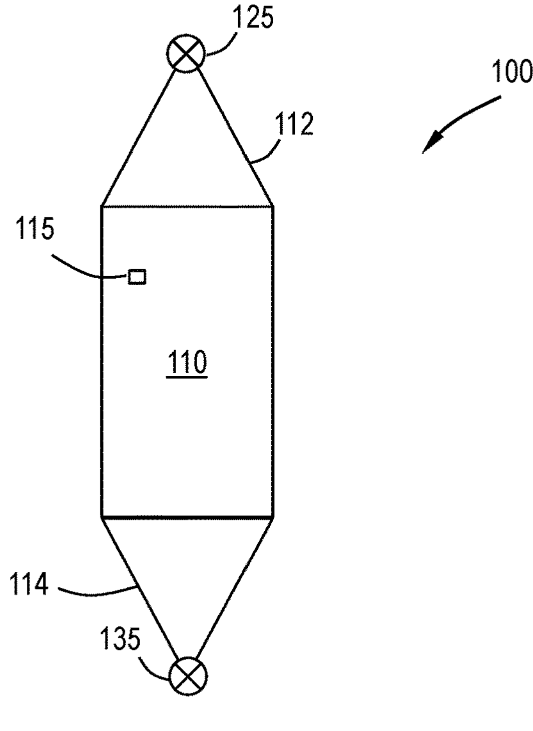
FIG. 2 illustrates a schematic cross-sectional view of a precursor delivery system according to one or more embodiments of the disclosure.

Referring to FIGS. 1 and 2, embodiments of the disclosure are directed to precursor delivery systems 100. The precursor delivery system 100 comprises a reservoir 110 having a cylindrical body with a conical shaped inlet 112 on a first end of the cylindrical body and a conical shaped outlet 114 on a second end of the cylindrical body. In one or more non-limiting embodiments, the conical shaped inlet 112 is on the second end of the cylindrical body and the conical shaped outlet 114 is on the first end of the cylindrical body.

During periodic maintenance and/or servicing of the processing chambers, the reservoirs may be exposed to moisture. The moisture may react with residual gases from the reservoirs, resulting in the presence of particles. The particles must be removed by purging prior to semiconductor wafer processing. Purging these particles is required to reduce defects on a semiconductor wafer that will be positioned in a processing chamber. Particles are typically removed (purged) from the processing chambers by flowing a purge gas, such as argon (Ar). In current precursor delivery systems with tube-shaped reservoirs, the purge process lasts in a range of from about 16 hours to about 24 hours to provide a reservoir that is substantially free of particles. Accordingly, a large amount of purge gas is required to complete the purge process using current precursor delivery systems.

In one or more embodiments, each of the conical shaped inlet 112 and the conical shaped outlet 114 independently having an angle in a range of from 5 degrees to 45 degrees. It has been advantageously found that the angle in a range of from 5 degrees to 45 degrees helps to flush out particles and increases laminarity and velocity of the gas flow, such as purge gas flow, into and out of the reservoir 110.

The reservoir 110 can be made of any suitable material known to the skilled artisan. Embodiments of the present disclosure provide reservoirs 110 that meet the Standard Specification for Seamless and Welded Austenitic Stainless Steel Tubing for General Service, as disclosed in ASTM A269, which is incorporated by reference herein in its entirety.

Without being bound by theory, it is thought that an angle of less than 5 degrees does not improve laminarity of gas flow into and out of the reservoir 110. It is also thought that an angle of greater than 45 degrees, such as an angle of 50 degrees, requires special tools to manufacture an inlet and/or outlet component having such an angle. It is thought that the tools for manufacturing an inlet and/or outlet component having an angle of greater than 45 degrees include, but are not limited to, a sheet metal die cutter for making the angle with tolerance, a bending apparatus, equipment for welding, a surface planing apparatus, particularly for the surfaces at the top and bottom of the conical shape, and an inside surface finishing tool, all of which would be known to the skilled artisan.

Without being bound by theory, it is thought that a larger angle within the range of from 5 degrees to 45 degrees, such as in a range of from 30 degrees to 45 degrees, increases velocity of the gas flow. In some embodiments, each of the conical shaped inlet 112 and the conical shaped outlet 114 independently have a 15 degree angle or a 20 degree angle.

The presence of the flat surfaces, which form corners, creates dead volume at the inlets and the outlets of current reservoirs. Due to the presence of inaccessible surface area portions of the reservoir (e.g., the flat surfaces and corners) and irregular flow path of the purge gases (e.g., a non-laminar flow), periodic maintenance and/or servicing of the processing chamber components is often inefficient. Precursor delivery using current reservoirs having flat top and bottom surfaces are susceptible to vortices within the reservoir. It is thought that an increased number of vertices within the reservoir results in an increased amount of particles formed on the surfaces, and the presence of vertices makes removing the particles from the surfaces more difficult. Additionally, it is thought that as density of each vertex increases, an increased amount of particles are formed. Advantageously, it has been observed that the reservoir 110 having the conical shaped inlet 112 and the conical shaped outlet 112 has fewer vertices (and thus, a decreased amount of particles) compared to reservoirs not having a conical shaped inlet and/or a conical shaped outlet. In some embodiments, the reservoir 110 having the conical shaped inlet 112 and the conical shaped outlet 114 is free of vertices.

It has been observed that the amount of time to purge the reservoir (e.g., reservoir 110) is reduced by at least 50% compared to reservoirs not having a conical shaped inlet and/or a conical shaped outlet. The reservoir designs of the present disclosure, such as reservoir 110, advantageously reduce purging time to about 4 hours to about 8 hours to provide a reservoir that is substantially free of particles. Advantageously, the reduction in purge time enables faster processing chamber startup time and reduces the amount of purge gas, such as argon (Ar), required to purge the particles.

Figure 3:
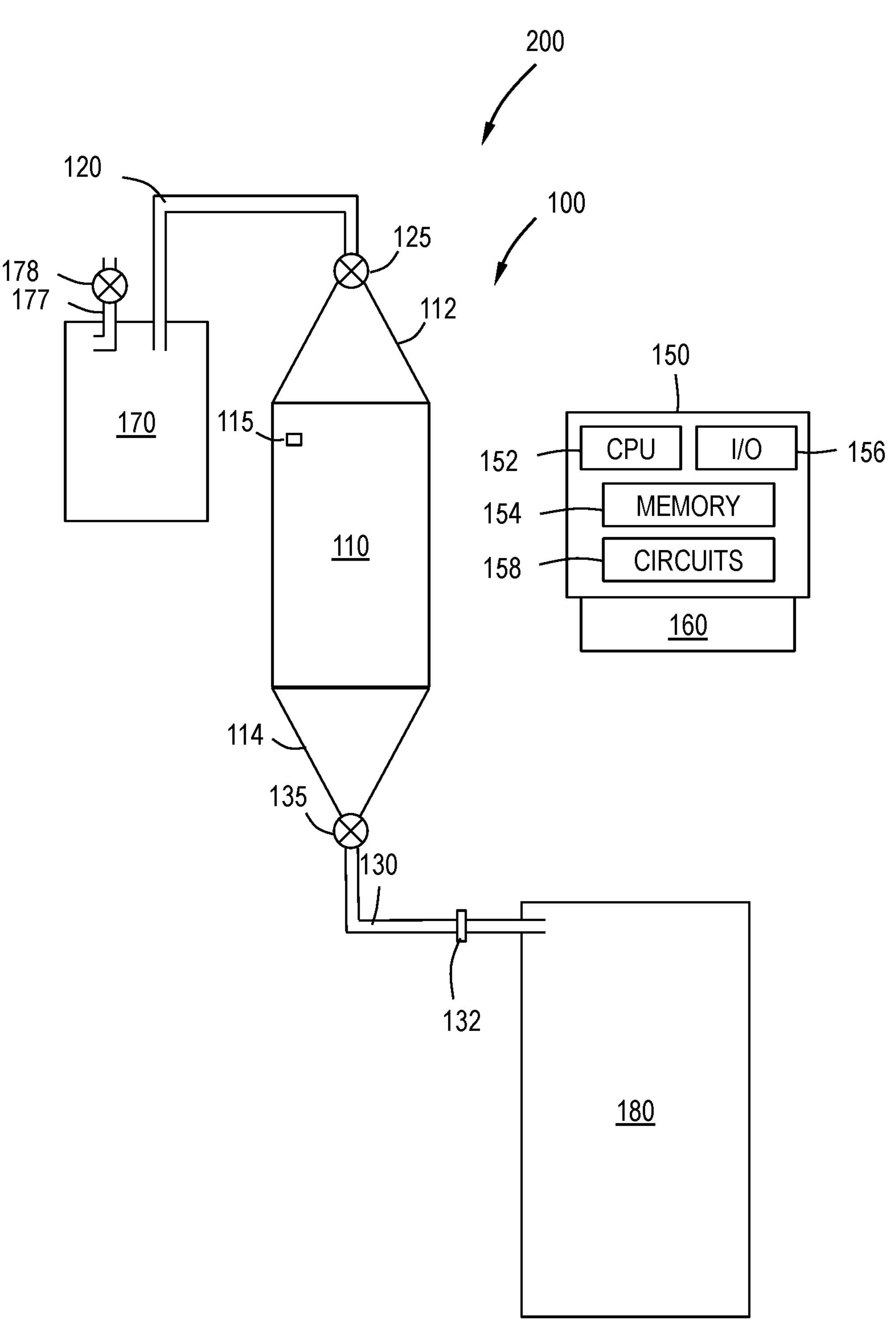
FIG. 3 illustrates a schematic view of a precursor delivery system according to one or more embodiments of the disclosure.

FIG. 3 illustrates a schematic view of a precursor delivery system 200. In one or more embodiments, the precursor delivery system 200 includes the precursor delivery system 100. In FIG. 3, the precursor delivery system 100 is connected to an inlet line 120 and an outlet line 130. In some embodiments, such as in FIGS. 1-4, there is an inlet valve 125 on the conical shaped inlet 112 and an outlet valve 135 on the conical shaped outlet 114. The inlet valve 125 is connected to the inlet line 120 and the outlet valve 135 is connected to the outlet line 130.

The reservoir 110 may have any suitable dimensions. The dimensions of the reservoir 110 may be modified in any manner envisaged by those skilled in the art so long as each of the conical shaped inlet 112 and the conical shaped outlet 114 independently have an angle in a range of from 5 degrees to 45 degrees. In one or more embodiments, the cylindrical body has a height of about 6 inches. In one or more embodiments, the cylindrical body has an inner diameter of about 3 inches. In one or more embodiments when the cylindrical body has an inner diameter of about 3 inches, the cylindrical body has a volume of about 1 liter (L).

In one or more embodiments, the reservoir 110 has a height of about 13 inches when including the conical shaped inlet 112 on the first end and the conical shaped outlet 114 on the second end. In one or more embodiments, the reservoir 110 has a height of about 15 inches when including the inlet valve 125 on the conical shaped inlet 112 and the outlet valve 135 on the conical shaped outlet.

Referring again to FIG. 3, the precursor delivery system 200 includes the precursor delivery system 100 that is connected to the inlet line 120 and the outlet line 130 and a controller 150 connected to each of the inlet valve 125 and the outlet valve 135.

In some embodiments, the controller 150 is configured to close the outlet valve 135 to pressurize the reservoir 110 and open the outlet valve 135 to provide a uniform flow of a purge gas from the reservoir 110 through the conical shaped outlet 114, through the outlet line 130 to a downstream component, for example, a processing chamber 180.

In some embodiments, a carrier gas comprising a precursor is delivered to the reservoir 110 through the inlet line 120. In some embodiments, the carrier gas comprising the precursor pressurizes the reservoir 110 when the outlet valve 135 is closed to a predetermined pressure.

In some embodiments, the controller 150 is connected to the inlet valve 125 and configured to open and close the inlet valve 125 to charge the reservoir 110 to a predetermined pressure. While not illustrated, the controller 150 can be connected to any of the components using a connection type known to the skilled artisan.

In some embodiments, the inlet valve 125 is opened to charge the reservoir 110 to a predetermined pressure. The pressure in the reservoir 110 can be measured using any pressure measurement device (e.g., pressure gauge 115) known to the skilled artisan. The pressure in the reservoir 110 can vary and may be optimized based on the particular precursor used.

In some embodiments, the inlet valve 125 is closed once the reservoir 110 has reached the predetermined pressure. The pressure gauge 115, or other pressure measurement device, can be located within the interior volume of the reservoir 110, as illustrated in the Figures, or can be located along inlet line 120 or outlet line 130. In some embodiments, one or more pressure measurement devices, such as pressure gauge 115, are located in one or more of the inlet line 120, outlet line 130 or reservoir 110.

In some embodiments, the inlet valve 125 is closed whenever the outlet valve 135 is open. In some embodiments, the inlet valve 125 is open whenever the outlet valve 135 is closed. Without being bound by theory, it is believed that only allowing one of the inlet valve 125 and the outlet valve 135 to be open at any given time prevents solid precursor particles from flowing directly from a precursor ampoule into the processing chamber. In some embodiments, the controller 150 is configured to close an open inlet valve 125 or an open outlet valve 135 before opening the other of the inlet valve 125 and outlet valve 135.

In some embodiments, the outlet valve 135 is a fast pulsing valve (also referred to as a fast switching valve or high speed valve) and an orifice 132 is located between the reservoir 110 and the outlet valve 135. In some embodiments, the fast pulsing valve is configured to open and/or close within 50 milliseconds. In some embodiments, the fast pulsing valve is configured to open and/or close within 40 milliseconds, 30 milliseconds, 20 milliseconds or 10 milliseconds. In some embodiments, the fast pulsing valve is a valve that is either fully open or fully closed. In some embodiments, the fast pulsing valve is a variable open valve that can allow modulation of the flow profile through the valve. In some atomic layer deposition (ALD) process embodiments, the outlet valve 135 is a fast switching valve used to control the delivery of gas to the chamber, and the inlet valve 125 is any valve that a skilled artisan would be familiar with that can operate on the time-scale of the ALD cycle.

The orifice 132 can be any suitable orifice that restricts flow through the outlet line 130. The orifice size depends on, for example, the particular gas flowing through the reservoir 110 and orifice 132, the operating pressure of the reservoir and/or the flow rate of gas through the orifice 132. The orifice 132 of some embodiments is a disk-shaped component with a precise aperture extending therethrough. In some embodiments, the orifice 132 has a size in the range of about 100 μm to about 1500 μm.

In some embodiments, the controller 150 is configured to pressurize reservoir 110 to a pressure sufficient to provide a uniform flow of gas from the reservoir 110 without decreasing the reservoir pressure by more than 25%, by more than 20%, by more than 15%, by more than 10%, by more than 5%, by more than 2%, or by more than 1%. In some embodiments, the reservoir pressure is sufficient so that a uniform flow of gas from the reservoir is provided over the course of a deposition process. In some embodiments, the reservoir pressure is sufficient so that a uniform flow of gas from the reservoir 110 is provided over the length of a precursor delivery pulse.

Without being bound by theory, it is believed that if the reservoir 110 is maintained at a high pressure, the flow of gas provided when the outlet valve 135 is opened will be uniform. As used in this regard, a "uniform gas flow" has a flow rate which varies by less than or equal to about 5%, less than or equal to about 2%, less than or equal to about 1%, or less than or equal to about 0.5% from the beginning of the pulse to the end of the pulse.

The controller 150 may be connected to one or more of the outlet valve 135, the inlet valve 125, and/or the heater 160. In some embodiments, there are more than one controller 150 connected to the individual parts and a primary control processor is coupled to each of the separate processors to control the precursor delivery system 100. The controller 150 may be one of any form of general-purpose computer processor, microcontroller, microprocessor, etc., that can be used in an industrial setting for controlling various chambers and sub-processors.

The controller 150 of some embodiments includes a processor 152, a memory 154 coupled to the processor 152, input/output devices 156 coupled to the processor 152, and support circuits 158 to communication between the different electronic and physical components. The memory 154 can include one or more of transitory memory (e.g., random access memory) and non-transitory memory (e.g., storage).

The memory 154, or computer-readable medium, of the processor may be one or more of readily available memory such as random access memory (RAM), read-only memory (ROM), floppy disk, hard disk, or any other form of digital storage, local or remote. The memory 154 can retain an instruction set that is operable by the processor 152 to control parameters and components of the precursor delivery systems 200, 250. The support circuits 158 are coupled to the processor 152 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the operation of the precursor delivery system such that the processes are performed.

In some embodiments, the controller 150 has one or more configurations to execute individual processes or sub-processes to perform deliver a chemical precursor using the precursor delivery systems 200, 250 described herein. The controller 150 can be connected to and configured to operate intermediate components to perform the functions of the methods. For example, the controller 150 can be connected to and configured to control one or more of gas valves, actuators, motors, heaters, etc.

The controller 150 of some embodiments has one or more configurations selected from: a configuration to open the outlet valve; a configuration to close the outlet valve; a configuration to open the inlet valve; a configuration to close the inlet valve; and a configuration to control a heater 160.

In some embodiments, the controller 150 is connected to a heater 160 to maintain the reservoir 110 at a predetermined temperature. In some embodiments, the predetermined temperature is high enough to prevent condensation of the precursor.

In some embodiments, the precursor delivery system 200 comprises a precursor source 170 in fluid communication with the inlet line 120. The precursor source 170 may include any suitable precursor known to the skilled artisan. In some embodiments, the precursor source 170 includes an amorphous silicon (a-Si) precursor. In some embodiments, the precursor source 170 includes an aluminum (Al) precursor. The precursor source 170 may include, but is not limited to, a transition metal precursor. In some embodiments, the precursor source 170 may include a titanium (Ti) precursor, a tungsten (W) precursor, and/or a tantalum (Ta) precursor. In one or more embodiments, the tungsten (W) precursor includes, but is not limited to tungsten pentachloride ($WCl_5$). In one or more embodiments, the precursor source includes a nitrogen-containing precursor, including, but not limited to, nitrogen ($N_2$) gas, ammonia ($NH_3$) gas, diazene ($N_2H_2$), or hydrazine ($N_2H_4$). In one or more embodiments, the precursor source includes argon (Ar) gas.

The purge time depends on the specific precursor used. It is thought that ammonia ($NH_3$) gas, for example, is sticky and forms more particles on the surfaces of the reservoir compared to other precursors. Thus, for example, the amount of time to purge the reservoir (e.g., reservoir 110) of ammonia ($NH_3$) gas may be longer than a different precursor that is not as sticky. Advantageously, it has been observed that the amount of time to purge the reservoir (e.g., reservoir 110) is reduced by at least 50%, such as 60% or 70%, compared to reservoirs not having a conical shaped inlet and/or a conical shaped outlet. The reduction in purge time advantageously enables faster processing chamber startup time and reduces the amount of purge gas, such as argon (Ar), required to purge the particles.

In some embodiments, the precursor source 170 is maintained at a temperature less than the predetermined temperature of the reservoir 110. In some embodiments, the temperature of the precursor source 170 is high enough to provide a vapor pressure of precursor within the precursor source 170. In some embodiments, the predetermined temperature of the reservoir 110 is high enough to prevent condensation of the precursor within the reservoir 110.

In some embodiments, the temperature of the precursor source is controlled at least at three locations. In some embodiments, the bottom of the precursor source 170 (e.g., an ampoule) is maintained at a first temperature, the top of the precursor source 170 is maintained at a second temperature greater than the first temperature and the reservoir 110 and portions of the inlet line 120 and outlet line 130 are maintained at a third temperature that is greater than the first temperature and second temperature. Without being bound by any particular theory of operation, it is believed that having the top of the precursor source 170 at a greater temperature than the bottom of the precursor source prevent vapor phase precursor from condensing or redepositing into liquid or solid precursor. Additionally, it is believed that maintaining the third temperature greater than the second temperature will further decrease the likelihood of condensing or deposition within the inlet line 120, reservoir 110 or outlet line 130. In some embodiments, a temperature gradient between the second temperature and first temperature, and/or between the third temperature and second temperature is sufficient to ensure that there is a negligible amount or no accumulation of condensed phase precursor except at the bottom of the precursor source. In some embodiments, the second temperature is at least about 1° C., 2° C., 3° C., 4° C., 5° C., 6° C., 7° C., 8° C., 9° C., 10° C., 11° C., 12° C., 13° C., 14° C., 15° C., 16° C., 17° C., 18° C., 19° C. or 20° C. greater than the first temperature. In some embodiments, the third temperature is at least about 1° C., 2° C., 3° C., 4° C., 5° C., 6° C., 7° C., 8° C., 9° C., 10° C., 11° C., 12° C., 13° C., 14° C., 15° C., 16° C., 17° C., 18° C., 19° C. or 20° C. greater than the second temperature. In some embodiments, limitations on how the heaters are built and installed increase the temperature setpoint differentials to ensure, within variances, that there are sufficient temperature gradients. In some embodiments, the temperature setpoint of a heater adjacent the top of the precursor source 170 (primarily controlling the second temperature) is in the range of about 5° C. to about 15° C. higher than a heater adjacent the bottom of the precursor source (primarily controlling the first temperature). The setpoints of the heaters in some embodiments depends on the volume the chemical occupies in the condensed phase in the precursor source.

In some embodiments, the precursor source 170 comprises one or more of a facility gas line or a precursor ampoule. In some embodiments, the facility gas line provides a precursor without a carrier gas. In some embodiments, the precursor ampoule provides a precursor which is solid or liquid at room temperature by heating the precursor to provide vaporized precursor within the precursor ampoule. The vaporized precursor is carried by a carrier gas into the reservoir. Referring to FIG. 3, some embodiments of the precursor source 170 include a source inlet line 177 with a source inlet valve 178. The source inlet line 177 of some embodiments is used to flow a carrier gas into the precursor source 170. The source inlet valve 178 of some embodiments allows for isolation of the precursor source 170 to prevent gas entering or leaving the precursor source 170 through the source inlet line 177.

In some embodiments, the precursor delivery system 200 comprises a processing chamber 180 in fluid communication with the outlet line 130. In some embodiments, the controller 150 is configured to open the outlet valve 135 to provide a uniform flow of gas from the reservoir 110 to the processing chamber 180.

In specific embodiments, the precursor delivery system 200 is part of an atomic layer deposition (ALD) process, chemical vapor deposition (CVD) process, pulsed CVD process, plasma-enhanced atomic layer (PEALD) process, and/or plasma-enhanced chemical vapor deposition (PECVD) process for depositing a film on a semiconductor substrate surface.

In some embodiments, the precursor delivery system 200 comprises a precursor source 170 in fluid communication with the inlet line 120. The precursor source 170 may include any suitable precursor known to the skilled artisan. The precursor source 170 may include, but is not limited to, a transition metal precursor. In some embodiments, the precursor source 170 may include a titanium precursor, a tungsten precursor, and/or a tantalum precursor.

In some embodiments, depositing a film comprises atomic layer deposition (ALD), which includes one or more cycles of exposing a semiconductor substrate surface to a first precursor, a purge gas, a second precursor, and the purge gas. In some embodiments, depositing film comprises a spatial ALD process, wherein a first reactive gas and second reactive gas are delivered simultaneously to a reaction zone but are separated by an inert gas curtain and/or a vacuum curtain. In some embodiments, depositing a film comprises co-flowing one or more precursors. In some embodiments, depositing a film comprises chemical vapor deposition (CVD). In some embodiments, depositing a film comprises pulsed chemical vapor deposition (pCVD), wherein one or both of the precursors is pulsed into a chamber.

In some embodiments, the precursor delivery system 200 is part of an atomic layer deposition (ALD) process to deposit a film comprising titanium nitride (TiN), titanium silicon nitride (TiSiN), tantalum nitride (TaN), titanium aluminum (TiAl), an alloy of amorphous silicon and titanium nitride (TiN), and any alloys and/or combinations thereof.

Figure 4:
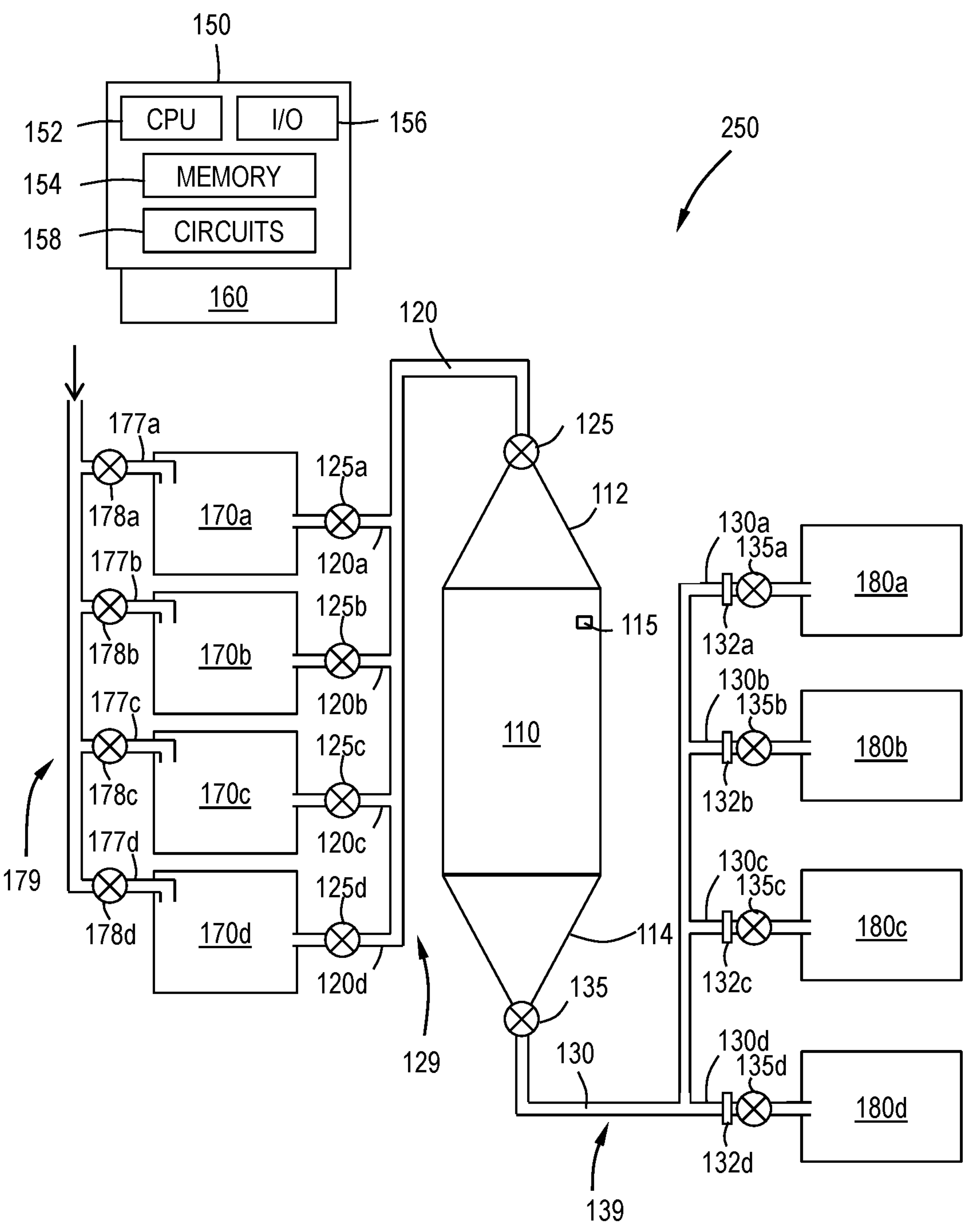
FIG. 4 illustrates a schematic view of a precursor delivery system according to one or more embodiments of the disclosure.

Referring to FIG. 4, in some embodiments, the precursor delivery system 200 comprises a plurality of inlet lines 120*a*, 120*b*, 120*c*, 120*d*, each inlet line 120*a*, 120*b*, 120*c*, 120*d*, having an inlet valve 125*a*, 125*b*, 125*c*, 125*d*. The embodiment illustrated in FIG. 4 allows the reservoir 110 to be charged with one or more than one different precursor. Each precursor source 170*a*, 170*b*, 170*c*, 170*d* has the same precursor or different precursors. For example, each precursor source 170*a*, 170*b*, 170*c*, 170*d* can have the same precursor which flow into the same reservoir 110 through inlet line 120. In some embodiments, the reservoir may be charged with precursor from several precursor sources 170*a*, 170*b*, 170*c*, 170*d*. Without being bound by theory, it is believed that the use of multiple precursor sources allows for greater concentrations of precursor within the reservoir 110. This is expected to be particularly noticeable for precursors with low vapor pressure.

The precursor sources 170*a*, 170*b*, 170*c*, 170*d* of some embodiments are connected to the reservoir 110 through an inlet manifold 129 connected to inlet line 120, as shown in FIG. 4. In some embodiments, each of the precursor sources 170*a*, 170*b*, 170*c*, 170*d* is connected to and in fluid communication with the reservoir through separate inlet lines (not illustrated). The inlet line 120 can include an inlet manifold valve 111 to isolate the inlet manifold 129 from the interior of the reservoir 110. The inlet valves 125*a*, 125*b*, 125*c*, 125*d* of some embodiments are independently controlled to connect the individual precursor source to the inlet manifold 129. This arrangement can, for example, allow for the replacement of one of the precursor sources without stopping a deposition process. The controller 150 of some embodiments is configured to adjust the pressure, flow rate and/or open/close times of the inlet valves 125*a*, 125*b*, 125*c*, 125*d* to the individual precursor sources to compensate for changes in the numbers of precursor sources connected to the inlet manifold 129.

In the illustrated embodiment, the outlet valves are positioned between the precursor source and the manifold and are controlled independently (or together) to charge the reservoir 110. The skilled artisan will recognize that the inlet valve 125 can be located between the inlet manifold 129 and the reservoir 110 so that the inlet valves 125*a*, 125*b*, 125*c*, 125*d* and inlet valve 125 functions and control are reversed. For example, the inlet valves illustrated may serve to connect the precursor source to the inlet manifold 129 and the inlet valve 125 acts as the control valve to charge the reservoir 110.

In some embodiments, each of the precursor sources 170*a*, 170*b*, 170*c*, 170*d* is connected to a carrier gas source. In the illustrated embodiment, each precursor source 170*a*, 170*b*, 170*c*, 170*d* is connected to the same carrier gas source through carrier manifold 179 and carrier inlet lines 177*a*, 177*b*, 177*c*, 177*d* through carrier inlet valves 178*a*, 178*b*, 178*c*, 178*d*. This allows a single carrier gas source (e.g., a house gas line) to provide carrier gas to all of the precursor sources 170*a*, 170*b*, 170*c*, 170*d* at the same time while allowing independent control over the gas flow through each of the precursor sources. In some embodiments, each of the precursor sources 170*a*, 170*b*, 170*c*, 170*d* is connected to separate carrier gas sources and can be independently controlled.

In some embodiments, the precursor delivery system 200 comprises a plurality of outlet lines 130*a*, 130*b*, 130*c*, 130*d* connected to and in fluid communication with outlet line 130 through outlet manifold 139. Each of the outlet lines 130*a*, 130*b*, 130*c*, 130*d* of some embodiments, as illustrated, has an outlet valve 135*a*, 135*b*, 135*c*, 135*d*. Each of the outlet lines 130*a*, 130*b*, 130*c*, 130*d* of some embodiments are connected to one or more processing chambers 180*a*, 180*b*, 180*c*, 180*d*. Stated differently, in some embodiments, the reservoir 110 may be fluidly connected to multiple processing chambers 180*a*, 180*b*, 180*c*, 180*d*. In some embodiments, as shown in FIG. 4, each outlet line 130*a*, 130*b*, 130*c*, 130*d* includes an orifice 132*a*, 132*b*, 132*c*, 132*d*, as described with respect to FIG. 3. Without being bound by theory, it is believed that the charged reservoir 110 can allows for greater throughput by providing precursor to multiple processing chambers 180*a*, 180*b*, 180*c*, 180*d*.

In some embodiments, the reservoir 110 is pressurized to a predetermined pressure greater than or equal to the pressure of the processing chamber 180. In some embodiments, the reservoir 110 has a pressure that is about 2 times, about 3 times, about 4 times, about 5 times, about 10 times, about 15 times, about 20 times, about 25 times, about 30 times, about 40 times, about 50 times, about 100 times, about 125 times, about 150 times, about 175 times, about 200 times, about 250 times, about 300 times, about 400 times, about 500 times, about 750 times or about 1000 times the pressure of the processing chamber 180. In some embodiments, the pressure ratio of the reservoir to process cavity in the processing chamber depends on the ratio of the volumes between the reservoir 110 and the process cavity in the processing chamber 180 and on the process flow rate. In some embodiments, the pressure of the reservoir 110 is maintained in the range of about 50 times to about 1000 times, or in the range of about 75 times to about 500 times, or in the range of about 100 times to about 200 times the process chamber pressure.

The volume of the reservoir 110 can be any suitable volume smaller than, the same as or larger than the volume of the process cavity in the processing chamber 180. In some embodiments, the reservoir 110 has a smaller volume than the process cavity. In some embodiments, the reservoir 110 has about the same volume (±10%) of the volume of the process cavity. In some embodiments, the volume of the reservoir 110 is greater than the volume of the processing chamber 180. For example, in a process in which a small concentration precursor is delivered with a high flow of carrier/purge gas, the reservoir volume is larger than the process cavity volume. In some embodiments, the reservoir 110 has a volume that is about 1.2 times, about 1.5 times, about 1.75 times, about 2 times, about 3 times, about 4 times, about 5 times, about 7 times, about 10 times, about 15 times, or about 20 times the volume of the processing chamber 180. In some embodiments, the reservoir volume is sufficient so that each pulse is a small fraction of the process cavity volume in the chamber.

In some embodiments, the reservoir 110 is charged to have the same pressure when the gas flow enters the inlet valve 125 and exits the outlet valve 135. It has been advantageously found that charging the reservoir 110 to have the same pressure when the gas flow enters the inlet valve 125 and exits the outlet valve 135 helps to flush out particles and increases laminarity and velocity of the gas flow, such as purge gas flow, into and out of the reservoir 110. It is thought that when the reservoir 110 is charged to different pressures when the gas flow enters the inlet valve 125 and exits the outlet valve 135, the gas may flow in an irregular flow path (e.g., a non-laminar flow) into and out of the reservoir 110.

Without being bound by theory, it is believed that when the reservoir 110 has a greater pressure than the processing chamber 180, the pulse of precursor delivered when the outlet valve is opened will be of a consistently high pressure as the pressure drop of the reservoir 110 in not substantial. As used in this regard, a pressure drop that is not substantial is less than or equal to about 25%, less than or equal to about 20%, less than or equal to about 15%, less than or equal to about 10%, less than or equal to about 5%, less than or equal to about 2%, or less than or equal to about 1% of the predetermined reservoir pressure before the outlet valve is opened.

Some embodiments of the disclosure relate to methods for delivering a precursor or reactive gas to, for example, a processing chamber, such as processing chamber 180. In some embodiments, the methods of the disclosure utilize a precursor delivery system as described herein. The methods according to some embodiments of the disclosure comprise using a controller 150 to charge a reservoir 110 with a precursor. The controller 150 is configured to open an inlet valve 125 on an inlet line 120 and close an outlet valve 135 on an outlet line 130. The inlet line 120 and outlet line 130 are in fluid communication with the reservoir 110. The controller 150 is used to provide a flow of precursor from the charged reservoir 110 through the outlet line 130. The controller is configured to open the outlet valve 135.

In some embodiments, the precursor is continuously provided to the reservoir 110. In some embodiments, the controller 150 is configured to close the inlet valve 125 while the outlet valve 135 is open. In some embodiments, the method further comprises repeating the opening and closing of the outlet valve 135. In some embodiments, the reservoir 110 is charged sufficiently to provide a duty cycle less than about 25%. In some embodiments, the controller 150 is configured to charge the reservoir 110 to a pressure sufficient to provide a uniform flow of gas from the reservoir without decreasing the reservoir pressure by more than 25%.

Additional embodiments are directed to a method of removing particles from a reservoir. The method includes providing a reservoir, such as reservoir 110 described herein, that is part of the precursor delivery system 100. The method includes using a controller, such as controller 150, to continuously provide a flow of a purge gas through the outlet line to remove particles from the reservoir. In some embodiments, the flow of the purge gas may be provided through the inlet line to remove particles from the reservoir. Advantageously, the method provides for the delivery of a precursor with fewer solid particles and lower levels of particle entrainment in resulting films. Some embodiments advantageously provide reservoirs configured to reduce the amount of time to purge the reservoir and remove an increased number of particles from the reservoir.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A precursor delivery system comprising:

a reservoir having a cylindrical body, a conical shaped inlet on a first end of the cylindrical body, and a conical shaped outlet on a second end of the cylindrical body, each of the conical shaped inlet and the conical shaped outlet independently having an angle in a range of from 5 degrees to 45 degrees.

2. The precursor delivery system of claim 1, further comprising an outlet valve on the conical shaped outlet, the outlet valve connected to an outlet line.

3. The precursor delivery system of claim 2, further comprising an inlet valve on the conical shaped inlet, the inlet valve connected to an inlet line.

4. The precursor delivery system of claim 3, further comprising a controller connected to the outlet valve, the controller configured to close the outlet valve to pressurize the reservoir and open the outlet valve to provide a uniform flow of a purge gas from the reservoir through the conical shaped outlet.

5. The precursor delivery system of claim 4, wherein the controller is connected to the inlet valve, the controller configured to open and close the inlet valve to charge the reservoir to a predetermined pressure.

6. The precursor delivery system of claim 4, wherein the controller is connected to a heater to maintain the reservoir at a predetermined temperature.

7. The precursor delivery system of claim 4, wherein an increased number of particles are removed from the reservoir compared to reservoirs not having a conical shaped inlet and/or a conical shaped outlet.

8. The precursor delivery system of claim 4, wherein an amount of time to purge the reservoir is reduced by at least 50% compared to reservoirs not having a conical shaped inlet and/or a conical shaped outlet.

9. The precursor delivery system of claim 3, further comprising a precursor source selected from one or more of a facility gas line or a precursor ampoule in fluid communication with the inlet line, the precursor source maintained at a temperature less than a predetermined temperature of the reservoir.

10. The precursor delivery system of claim 1, wherein the angle of each of the conical shaped inlet and the conical shaped outlet is 20 degrees.

11. The precursor delivery system of claim 1, wherein the cylindrical body has a height of about 6 inches.

12. The precursor delivery system of claim 1, wherein the cylindrical body has an inner diameter of about 3 inches.

13. The precursor delivery system of claim 1, wherein the reservoir has a height of about 13 inches.

14. A precursor delivery system comprising:

a reservoir having a cylindrical body, a conical shaped inlet on a first end of the cylindrical body, and a conical shaped outlet on a second end of the cylindrical body, each of the conical shaped inlet and the conical shaped outlet independently having an angle in a range of from 5 degrees to 45 degrees, the conical shaped inlet having an inlet valve connected to an inlet line and the conical shaped outlet having an outlet valve connected to an outlet line; and a controller connected to each of the inlet valve and the outlet valve, the controller configured to close the outlet valve to pressurize the reservoir and open the outlet valve to provide a uniform flow of a purge gas from the reservoir through the conical shaped outlet.

15. The precursor delivery system of claim 14, wherein the angle of each of the conical shaped inlet and the conical shaped outlet is 20 degrees.

16. The precursor delivery system of claim 14, wherein the reservoir has a height of about 13 inches and the cylindrical body has a height of about 6 inches and an inner diameter of about 3 inches.

17. The precursor delivery system of claim 14, wherein an increased number of particles are removed from the reservoir compared to reservoirs not having a conical shaped inlet and/or a conical shaped outlet.

18. The precursor delivery system of claim 14, wherein an amount of time to purge the reservoir is reduced by at least 50% compared to reservoirs not having a conical shaped inlet and/or a conical shaped outlet.

19. A method comprising:

providing the precursor delivery system of claim 1, wherein the conical shaped inlet has an inlet valve connected to an inlet line and the conical shaped outlet has an outlet valve connected to an outlet line, and the inlet line and the outlet line are in fluid communication with the reservoir; and using a controller to continuously provide a flow of a purge gas through the outlet line to remove particles from the reservoir.

20. The method of claim 19, wherein an amount of time to purge the reservoir is reduced by at least 50% and an increased number of particles are removed in the reservoir compared to reservoirs not having a conical shaped inlet and/or a conical shaped outlet.

* * * * *